United States Patent
Itoh et al.

(10) Patent No.: US 9,394,439 B2
(45) Date of Patent: Jul. 19, 2016

(54) RESIN COMPOSITION, PREPREG, RESIN SHEET, AND METAL FOIL-CLAD LAMINATE

(71) Applicant: MITSUBISHI GAS CHEMICAL COMPANY, INC., Tokyo (JP)

(72) Inventors: Syouichi Itoh, Tokyo (JP); Emi Fukasawa, Tokyo (JP); Yoshitaka Ueno, Tokyo (JP); Michio Yaginuma, Tokyo (JP)

(73) Assignee: MITSUBISHI GAS CHEMICAL COMPANY, INC., Tokyo (JP)

( * ) Notice: Subject to any disclaimer, the term of this patent is extended or adjusted under 35 U.S.C. 154(b) by 0 days.

(21) Appl. No.: 14/388,506

(22) PCT Filed: Mar. 14, 2013

(86) PCT No.: PCT/JP2013/057220
§ 371 (c)(1),
(2) Date: Sep. 26, 2014

(87) PCT Pub. No.: WO2013/146302
PCT Pub. Date: Oct. 3, 2013

(65) Prior Publication Data
US 2015/0017449 A1    Jan. 15, 2015

(30) Foreign Application Priority Data
Mar. 29, 2012   (JP) .................. 2012-077449

(51) Int. Cl.
| | |
|---|---|
| B32B 15/08 | (2006.01) |
| B32B 15/082 | (2006.01) |
| B32B 15/092 | (2006.01) |
| B32B 27/04 | (2006.01) |
| B32B 27/18 | (2006.01) |
| B32B 27/28 | (2006.01) |
| B32B 27/30 | (2006.01) |
| B32B 27/38 | (2006.01) |
| C08L 63/00 | (2006.01) |
| C08L 71/12 | (2006.01) |

(Continued)

(52) U.S. Cl.
CPC ............. *C08L 71/126* (2013.01); *B32B 15/08* (2013.01); *B32B 15/14* (2013.01); *C08J 5/24* (2013.01); *C08L 63/00* (2013.01); *C08L 71/12* (2013.01); *H05K 1/0353* (2013.01); *H05K 1/056* (2013.01); *H05K 3/44* (2013.01); *B32B 2260/046* (2013.01); *B32B 2305/076* (2013.01); *C08J 2371/12* (2013.01); *C08J 2425/06* (2013.01); *C08J 2463/04* (2013.01); *C08J 2475/00* (2013.01); *C08J 2485/02* (2013.01); *C08K 5/315* (2013.01); *C08K 5/5313* (2013.01); *C08K 5/5399* (2013.01); *C08L 2201/02* (2013.01); *C08L 2203/206* (2013.01); *C08L 2205/035* (2013.01); *H05K 1/0366* (2013.01); *H05K 2201/0209* (2013.01); *H05K 2203/06* (2013.01); *Y10T 156/10* (2015.01); *Y10T 428/31511* (2015.04); *Y10T 428/31522* (2015.04); *Y10T 428/31529* (2015.04)

(58) Field of Classification Search
None
See application file for complete search history.

(56) References Cited

U.S. PATENT DOCUMENTS

| | | | |
|---|---|---|---|
| 2004/0152848 A1 | 8/2004 | Ishii et al. | |
| 2004/0152910 A1* | 8/2004 | Fukuoka et al. | 558/75 |

(Continued)

FOREIGN PATENT DOCUMENTS

| | | |
|---|---|---|
| CN | 101508844 A | 8/2009 |
| CN | 102181143 A | 9/2011 |

(Continued)

OTHER PUBLICATIONS

Machine translation of JP 2010059363 A, provided by the JPO website (no date).*

(Continued)

*Primary Examiner* — Michael J Feely
(74) *Attorney, Agent, or Firm* — Greenblum & Bernstein, P.L.C.

(57) ABSTRACT

A resin composition has high flame retardancy and excellent heat resistance, peel strength with copper foil, thermal expansion coefficient, heat resistance property upon moisture absorption, and electrical properties, a prepreg and single-layer or laminated sheet, a metal foil-clad laminate using the prepreg, and the like. The resin composition has polyphenylene ether (A) having a number average molecular weight of 500 to 5000, a phosphorus-containing cyanate ester compound (B) represented by formula (13), a cyclophosphazene compound (C), a halogen-free epoxy resin (D), a cyanate ester compound (E) other than the phosphorus-containing cyanate ester compound (B), an oligomer (F) of styrene and/or substituted styrene, and a filler (G), wherein a content of the phosphorus-containing cyanate ester compound (B) is 1 to 10 parts by mass based on 100 parts by mass of a total of the (A) to (F) components.

[Formula 1]

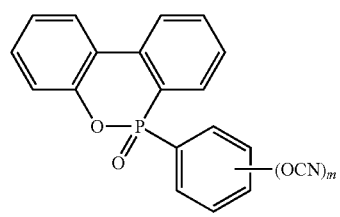

(13)

wherein m represents an integer of 1 to 3.

13 Claims, No Drawings

(51) Int. Cl.
    *C08J 5/24*     (2006.01)
    *B32B 15/14*     (2006.01)
    *H05K 1/03*     (2006.01)
    *H05K 1/05*     (2006.01)
    *H05K 3/44*     (2006.01)
    *C08K 5/5313*     (2006.01)
    *C08K 5/5399*     (2006.01)
    *C08K 5/315*     (2006.01)

(56) References Cited

U.S. PATENT DOCUMENTS

2009/0203279 A1*    8/2009    Mori et al. .................... 442/233
2010/0218982 A1    9/2010    Fujiwara et al.
2014/0073721 A1    3/2014    Yaginuma et al.

FOREIGN PATENT DOCUMENTS

| | | | | |
|---|---|---|---|---|
| EP | 2090612 A1 | 8/2009 | | |
| JP | 09025349 A * | 1/1997 | ................ | C08J 5/24 |
| JP | 10-273518 | 10/1998 | | |
| JP | 10-292122 | 11/1998 | | |
| JP | 11-35795 | 2/1999 | | |
| JP | 2000248169 A * | 9/2000 | ............. | C08L 71/12 |
| JP | 2002-194212 | 7/2002 | | |
| JP | 2002-194235 | 7/2002 | | |
| JP | 2003-221430 | 8/2003 | | |
| JP | 2004-231729 | 8/2004 | | |
| JP | 3633673 B2 | 3/2005 | | |
| JP | 2005-120173 | 5/2005 | | |
| JP | 2008-88079 | 4/2008 | | |
| JP | 2009-73996 | 4/2009 | | |
| JP | 2010059363 A * | 3/2010 | ............. | C08G 59/32 |
| JP | 2011-246612 | 12/2011 | | |
| WO | 2009/041137 | 4/2009 | | |
| WO | 2012/128313 | 9/2012 | | |

OTHER PUBLICATIONS

Machine translation of JP 2000248169 A, provided by the JPO website (no date).*
Machine translation of JP 09025349 A, provided by the JPO website (no date).*
International Preliminary Report on Patentability Appl. No. PCT/JP2013/057220, mail date is Oct. 1, 2014.
Search report from International Patent Appl. No. PCT/JP2013/057220, mail date is Jun. 18, 2013.

* cited by examiner

RESIN COMPOSITION, PREPREG, RESIN SHEET, AND METAL FOIL-CLAD LAMINATE

TECHNICAL FIELD

The present invention relates to a resin composition, a prepreg, a resin sheet, a metal foil-clad laminate, and the like, and particularly to a prepreg, a metal foil-clad laminate and the like used in a printed wiring board forming an electrical circuit.

BACKGROUND ART

In recent years, information terminal equipment including personal computers and servers, and communication equipment, such as Internet routers and optical communication, have been required to process massive information at high speed, and the speed and frequency of electrical signals have become higher. With this, in addition to conventionally required properties such as flame retardancy, heat resistance, and peel strength with copper foil and the like, lower dielectric constant and lower dielectric loss tangent have been required of printed wiring board materials used in the equipment. In order to meet the requirement of these properties, various attempts have been made in the formulation of resin compositions.

In order to provide electrical properties to such materials, a method of incorporating, in a resin composition, a resin having a low dielectric constant and a low dielectric loss tangent, such as a fluororesin, a cyanate ester resin, a polyphenylene ether resin, or a vinyl compound mainly comprising styrene, is known (for example, see Patent Literature 1). However, generally, a laminate using such a resin or compound has poor flame retardancy, and therefore, in order to provide high flame retardancy, it is necessary to contain a halogen-based compound in the resin composition (for example, see Patent Literatures 2 and 3). But, when a halogen-based compound is used, environmental problems arise, for example, harmful substances, such as dioxin, may be generated during burning.

Therefore, as other methods for increasing flame retardancy, for example, studies of adding a compound containing phosphorus or nitrogen to a resin composition are made (for example, see Patent Literatures 4 and 5). However, in the case of a nitrogen-containing compound, harmful nitrogen oxide may be produced, and in the case of a conventionally used phosphorus-containing compound, a problem is that as the amount of the phosphorus-containing compound added is increased in order to provide high flame retardancy, the heat resistance deteriorates, that is, the glass transition temperature (Tg) of the resin composition decreases (for example, see Patent Literatures 6 and 7).

CITATION LIST

Patent Literature

Patent Literature 1: Japanese Patent Laid-Open No. 2002-194212
Patent Literature 2: Japanese Patent Laid-Open No. H10-273518
Patent Literature 3: Japanese Patent Laid-Open No. 2005-120173
Patent Literature 4: Japanese Patent Laid-Open No. H11-035795
Patent Literature 5: Japanese Patent Laid-Open No. 2002-194235
Patent Literature 6: Japanese Patent Laid-Open No. H10-292122
Patent Literature 7: Japanese Patent Laid-Open No. 2003-221430

SUMMARY OF INVENTION

Technical Problem

As described above, conventionally, it has been possible to increase flame retardancy even without using a halogen-based compound, by blending a nitrogen-containing compound or a phosphorus-containing compound into a resin composition. However, a resin composition that not only has high flame retardancy but also has highly balanced heat resistance, peel strength with copper foil, thermal expansion coefficient, heat resistance property upon moisture absorption, and electrical properties, such as low dielectric constant and low dielectric loss tangent, has not been obtained.

The present invention has been made in view of the above problem, and it is an object of the present invention to provide a resin composition with which a printed wiring board that not only has high flame retardancy but also has excellent heat resistance, peel strength with copper foil, thermal expansion coefficient, heat resistance property upon moisture absorption, and electrical properties can be provided, a prepreg and a single-layer or laminated sheet using the same, a metal foil-clad laminate and a printed wiring board using the above prepreg, and the like.

Solution to Problem

The present inventors have diligently studied the above problem, and, as a result, found that the above problem can be solved by using a resin composition containing polyphenylene ether having a particular number average molecular weight, a particular phosphorus-containing cyanate ester compound, a cyclophosphazene compound, a halogen-free epoxy resin, a cyanate ester compound other than the above phosphorus-containing cyanate ester compound, an oligomer of styrene and/or substituted styrene, and a filler, arriving at the present invention.

Specifically, the present invention provides the following <1> to <19>.
<1> A resin composition comprising:
polyphenylene ether (A) having a number average molecular weight of 500 to 5000,
a phosphorus-containing cyanate ester compound (B) represented by the following formula (13):

[Formula 1]

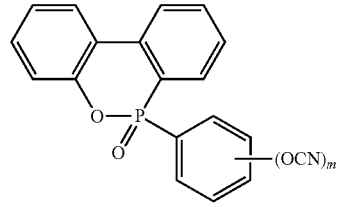

(13)

wherein m represents an integer of 1 to 3,
a cyclophosphazene compound (C),
a halogen-free epoxy resin (D), a cyanate ester compound (E) other than the phosphorus-containing cyanate ester compound (B),
an oligomer (F) of styrene and/or substituted styrene, and
a filler (G),
wherein a content of the phosphorus-containing cyanate ester compound (B) is 1 to 10 parts by mass based on 100 parts by mass of a total of the (A) to (F) components.

<2> The resin composition according to <1> above,
wherein the cyclophosphazene compound (C) is represented by the following formula (14):

[Formula 2]

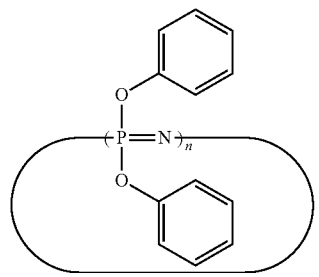

(14)

wherein n represents an integer of 3 to 6.

<3> The resin composition according to <1> or <2> above,
wherein a content of the cyclophosphazene compound (C) is 10 to 25 parts by mass based on 100 parts by mass of the total of the (A) to (F) components.

<4> The resin composition according to any one of <1> to <3> above, wherein the polyphenylene ether (A) is represented by the following general formula (4):

[Formula 3]

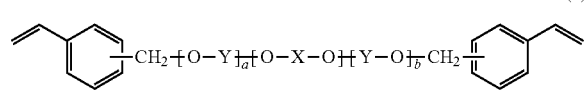

(4)

wherein —(O—X—O)— is a structure represented by the following general formula (5) or (6):

[Formula 4]

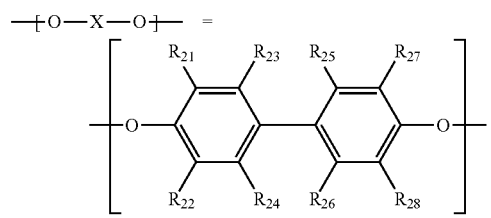

(5)

wherein $R_{21}$, $R_{22}$, $R_{23}$, $R_{27}$, and $R_{28}$ are each an alkyl group having 6 or less carbon atoms, or a phenyl group, and may be the same as or different from each other, and $R_{24}$, $R_{25}$, and $R_{26}$ are each a hydrogen atom, an alkyl group having 6 or less carbon atoms, or a phenyl group, and may be the same as or different from each other,

[Formula 5]

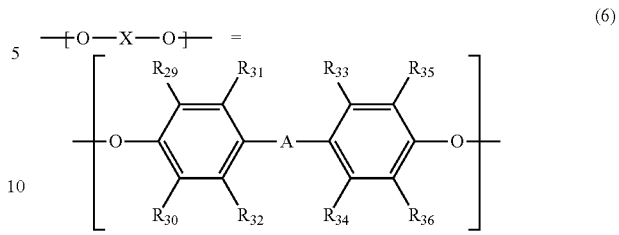

(6)

wherein $R_{29}$, $R_{30}$, $R_{31}$, $R_{32}$, $R_{33}$, $R_{34}$, $R_{35}$, and $R_{36}$ are each a hydrogen atom, an alkyl group having 6 or less carbon atoms, or a phenyl group, and may be the same as or different from each other, and -A- is a linear, branched, or cyclic divalent hydrocarbon group having 20 or less carbon atoms,
—(Y—O)— is a structure represented by the following general formula (7):

[Formula 6]

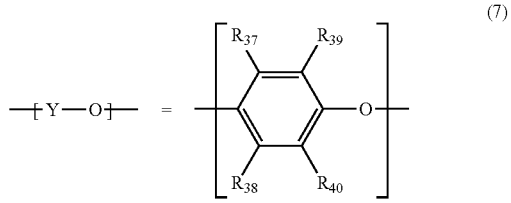

(7)

wherein $R_{39}$ and $R_{40}$ are each an alkyl group having 6 or less carbon atoms, or a phenyl group, and may be the same as or different from each other, and $R_{37}$ and $R_{38}$ are each a hydrogen atom, an alkyl group having 6 or less carbon atoms, or a phenyl group, and may be the same as or different from each other,
as —(Y—O)—, one type of structure or two or more types of structures are randomly arranged; and
a and b each independently represent an integer of 0 to 100, at least either one being not 0.

<5> The resin composition according to any one of <1> to <4> above, wherein a content of the polyphenylene ether (A) is 40 to 80 parts by mass based on 100 parts by mass of the total of the (A) to (F) components.

<6> The resin composition according to any one of <1> to <5> above, wherein the halogen-free epoxy resin (D) is one or more selected from the group consisting of a naphthalene-modified epoxy resin, a cresol novolac-based epoxy resin, and a bisphenol A-based epoxy resin.

<7> The resin composition according to any one of <1> to <6> above, wherein a content of the halogen-free epoxy resin (D) is 3 to 20 parts by mass based on 100 parts by mass of the total of the (A) to (F) components.

<8> The resin composition according to any one of <1> to <7> above, wherein the cyanate ester compound (E) other than the phosphorus-containing cyanate ester compound (B) is one or more selected from the group consisting of a bisphenol A-based cyanate ester compound and a naphthol aralkyl-based cyanate ester compound.

<9> The resin composition according to any one of <1> to <8> above, wherein a content of the cyanate ester compound (E) other than the phosphorus-containing cyanate ester compound (B) is 5 to 30 parts by mass based on 100 parts by mass of the total of the (A) to (F) components.

<10> The resin composition according to any one of <1> to <9> above, wherein a content of the oligomer (F) of styrene and/or substituted styrene is 0.1 to 5 parts by mass based on 100 parts by mass of the total of the (A) to (F) components.

<11> The resin composition according to any one of <1> to <10> above, wherein the oligomer (F) of styrene and/or substituted styrene has a number average molecular weight of 200 to 1000.

<12> The resin composition according to any one of <1> to <11> above, wherein a content of the filler (G) is 20 to 150 parts by mass based on 100 parts by mass of the total of the (A) to (F) components.

<13> The resin composition according to any one of <1> to <12> above, wherein the filler (G) is silica.

<14> A prepreg obtained by impregnating or coating a base material with the resin composition according to any one of <1> to <13> above.

<15> A metal foil-clad laminate obtained by stacking at least one or more prepregs according to <14> above;

disposing metal foil on one surface or both surfaces of an resulting stack; and laminate-molding the metal foil and the stack.

<16> A single-layer sheet obtained by forming the resin composition according to any one of <1> to <13> above into a sheet shape.

<17> A laminated sheet obtained by coating a surface of a sheet base material with the resin composition according to any one of <1> to <13> above; and drying the resin composition.

<18> The laminated sheet according to <17> above, wherein the sheet base material is one or more selected from the group consisting of a film containing polyvinyl chloride, polyvinylidene chloride, polybutene, polybutadiene, polyurethane, an ethylene-vinyl acetate copolymer, polyethylene terephthalate, polyethylene, polypropylene, an ethylene-propylene copolymer, polymethylpentene, or polybutylene terephthalate; aluminum foil; and copper foil.

<19> A printed wiring board comprising an insulating layer and a conductor layer formed on a surface of the insulating layer, wherein the insulating layer comprises the resin composition according to any one of <1> to <13> above.

Advantageous Effects of Invention

According to the present invention, a prepreg, a single-layer or laminated sheet, a metal foil-clad laminate, and the like that not only have excellent flame retardancy but also have excellent heat resistance, peel strength with copper foil, thermal expansion coefficient, heat resistance property upon moisture absorption, and electrical properties can be provided, and a high performance printed wiring board also can be provided. In addition, according to a preferred aspect of the present invention, a resin composition comprising only halogen-free compounds (that is, a resin composition comprising no halogen-based compounds, a halogen-free resin composition), and a prepreg, a single-layer or laminated sheet, a metal foil-clad laminate, and the like comprising only halogen-free compounds can also be provided, and their industrial practicality is extremely high.

DESCRIPTION OF EMBODIMENTS

Embodiments of the present invention will be described below. The following embodiments are illustrations for describing the present invention, and the present invention is not limited only to the embodiments.

A resin composition in the present embodiment is a resin composition comprising polyphenylene ether (A) having a number average molecular weight of 500 to 5000, a phosphorus-containing cyanate ester compound (B) represented by the following formula (13), a cyclophosphazene compound (C), a halogen-free epoxy resin (D), a cyanate ester compound (E) other than the above phosphorus-containing cyanate ester compound (B), an oligomer (F) of styrene and/or substituted styrene, and a filler (G), wherein the content of the above phosphorus-containing cyanate ester compound (B) is 1 to 10 parts by mass based on 100 parts by mass of the total of the above (A) to (F) components.

[Formula 7]

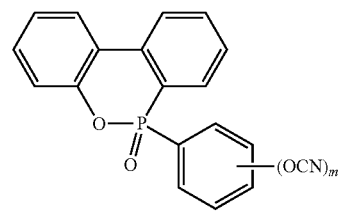

(13)

wherein m represents an integer of 1 to 3.

As the polyphenylene ether (A) used in the resin composition in the present embodiment, a known one can be appropriately used, and the type of the polyphenylene ether (A) is not particularly limited. The polyphenylene ether (A) is preferably a polymer comprising at least a repeating unit represented by the following general formula (1):

[Formula 8]

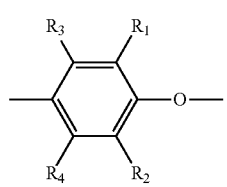

(1)

wherein $R_1$, $R_2$, $R_3$, and $R_4$ are each an alkyl group having 6 or less carbon atoms, an aryl group, a halogen atom, or a hydrogen atom, and may be the same as or different from each other. The polymer may further comprise a repeating unit represented by the following general formula (2):

[Formula 9]

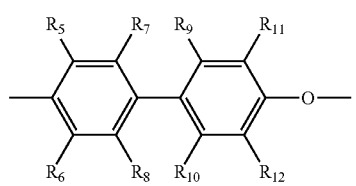

(2)

wherein $R_5$, $R_6$, $R_7$, $R_{11}$, and $R_{12}$ are each an alkyl group having 6 or less carbon atoms, or a phenyl group, and may be the same as or different from each other, and $R_8$, $R_9$, and $R_{10}$ are each a hydrogen atom, an alkyl group having 6 or less carbon atoms, or a phenyl group, and may be the same as or different from each other, and/or a repeating unit represented by the following general formula (3):

[Formula 10]

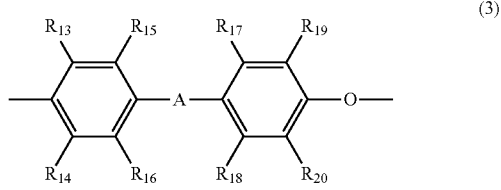

(3)

wherein $R_{13}$, $R_{14}$, $R_{15}$, $R_{16}$, $R_{17}$, $R_{18}$, $R_{19}$, and $R_{20}$ are each a hydrogen atom, an alkyl group having 6 or less carbon atoms, or a phenyl group, and may be the same as or different from each other, and -A- is a linear, branched, or cyclic divalent hydrocarbon group having 20 or less carbon atoms.

The polyphenylene ether (A) may be polyphenylene ether part or all of which is functionalized with an ethylenic unsaturated group, such as a vinylbenzyl group, an epoxy group, an amino group, a hydroxyl group, a mercapto group, a carboxyl group, a silyl group, and the like, that is, modified polyphenylene ether.

The method for manufacturing modified polyphenylene ether is not particularly limited, and can be performed according to an ordinary method. For example, one functionalized with a vinylbenzyl group can be manufactured by dissolving a bifunctional phenylene ether oligomer and vinylbenzyl chloride in a solvent, and adding a base while heating and stirring to thereby allow them to react. One functionalized with a carboxyl group can be manufactured, for example, by melting and kneading polyphenylene ether with an unsaturated carboxylic acid or a derivative thereof in the presence or absence of a radical initiator to thereby allow them to react. Alternatively, one functionalized with a carboxyl group can also be manufactured by dissolving polyphenylene ether and an unsaturated carboxylic acid or a derivative thereof in an organic solvent in the presence or absence of a radical initiator to thereby allow them to react in the solution.

Among these, the polyphenylene ether (A) preferably comprises modified polyphenylene ether having ethylenic unsaturated groups at both ends. Here, examples of the ethylenic unsaturated group include, but are not particularly limited to, alkenyl groups, such as an ethenyl group, an allyl group, a methallyl group, a propenyl group, a butenyl group, a hexenyl group, and an octenyl group, cycloalkenyl groups, such as a cyclopentenyl group and a cyclohexenyl group, and alkenylaryl groups, such as a vinylbenzyl group and a vinylnaphthyl group. Among these, a vinylbenzyl group is preferred. One of the above-described polyphenylene ethers can be used alone, or two or more of the above-described polyphenylene ethers can be used in combination. Two ethylenic unsaturated groups at both ends may be the same functional groups or different functional groups.

Particularly, the polyphenylene ether (A) used in the present embodiment more preferably comprises modified polyphenylene ether represented by the following general formula (4):

[Formula 11]

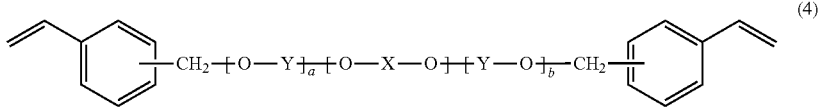

(4)

wherein —(O—X—O)— is a structure represented by the following general formula (5) or (6):

[Formula 12]

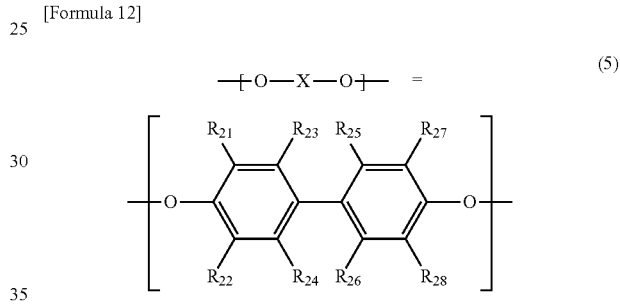

(5)

wherein $R_{21}$, $R_{22}$, $R_{23}$, $R_{27}$, and $R_{28}$ are each an alkyl group having 6 or less carbon atoms, or a phenyl group, and may be the same as or different from each other, and $R_{24}$, $R_{25}$, and $R_{26}$ are each a hydrogen atom, an alkyl group having 6 or less carbon atoms, or a phenyl group, and may be the same as or different from each other,

[Formula 13]

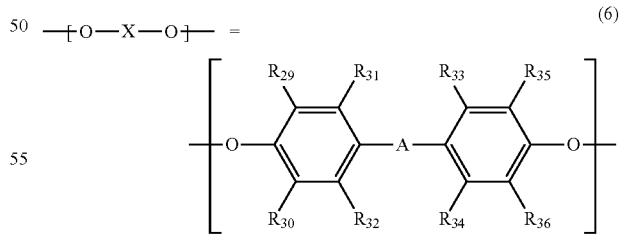

(6)

wherein $R_{29}$, $R_{30}$, $R_{31}$, $R_{32}$, $R_{33}$, $R_{34}$, $R_{35}$, and $R_{36}$ are each a hydrogen atom, an alkyl group having 6 or less carbon atoms, or a phenyl group, and may be the same as or different from each other, and -A- is a linear, branched, or cyclic divalent hydrocarbon group having 20 or less carbon atoms, —(Y—O)— is a structure represented by the following general formula (7):

[Formula 14]

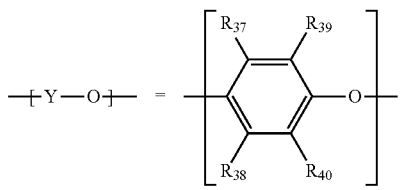
(7)

wherein $R_{39}$ and $R_{40}$ are each an alkyl group having 6 or less carbon atoms, or a phenyl group, and may be the same as or different from each other, and $R_{37}$ and $R_{38}$ are each a hydrogen atom, an alkyl group having 6 or less carbon atoms, or a phenyl group, and may be the same as or different from each other, as —(Y—O)—, one type of structure or two or more types of structures are randomly arranged; and a and b each independently represent an integer of 0 to 100, at least either one being an integer of 1 or more.

Here, the alkyl group having 6 or less carbon atoms means a linear or branched alkyl group having 1 to 6 carbon atoms. Specific examples thereof include, but are not particularly limited to, a methyl group, an ethyl group, a n-propyl group, an iso-propyl group, a n-butyl group, an iso-butyl group, a sec-butyl group, and a tert-butyl group. The aryl group means a monocyclic group having 6 to 14 carbon atoms, or a condensed cyclic group, such as a bicyclic or tricyclic group. Specific examples thereof include, but are not particularly limited to, a phenyl group, an indenyl group, a naphthyl group, an azulenyl group, a heptalenyl group, a biphenyl group, an indacenyl group, an acenaphthylenyl group, a fluorenyl group, a phenalenyl group, a phenanthrenyl group, an anthracenyl group, a cyclopentacyclooctenyl group, or a benzocyclooctenyl group. Examples of the halogen atom include a fluorine atom, a chlorine atom, and a bromine atom.

Examples of -A- in the above general formulas (3) and (6) include, but are not limited to, divalent organic groups, such as methylene, ethylidene, 1-methylethylidene, 1,1-propylidene, 1,4-phenylenebis(1-methylethylidene), 1,3-phenylenebis(1-methylethylidene), cyclohexylidene, phenylmethylene, naphthylmethylene, and 1-phenylethylidene.

Among the polyphenylene ethers represented by the above general formula (4), polyphenylene ether in which $R_{21}$, $R_{22}$, $R_{23}$, $R_{27}$, $R_{28}$, $R_{39}$, and $R_{40}$ are each an alkyl group having 3 or less carbon atoms, and $R_{24}$, $R_{25}$, $R_{26}$, $R_{29}$, $R_{30}$, $R_{31}$, $R_{32}$, $R_{33}$, $R_{34}$, $R_{35}$, $R_{36}$, $R_{37}$, and $R_{38}$ are each a hydrogen atom or an alkyl group having 3 or less carbon atoms is more preferred. Especially, polyphenylene ether in which —(O—X—O)— in the structure represented by the above general formula (5) or (6) is the following formula (8) or the following general formula (9) or (10), and —(Y—O)— in the structure represented by the above general formula (7) is the following formula (11) or (12), or a random arrangement of the following formula (11) and the following formula (12) is particularly preferred.

[Formula 15]

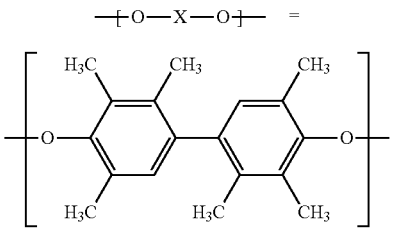
(8)

[Formula 16]

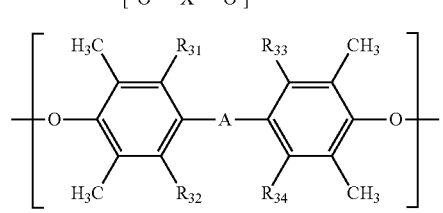
(9)

wherein $R_{31}$, $R_{32}$, $R_{33}$, and $R_{34}$ are each a hydrogen atom or a methyl group, and may be the same as or different from each other, and -A- is a linear, branched, or cyclic divalent hydrocarbon group having 20 or less carbon atoms,

[Formula 17]

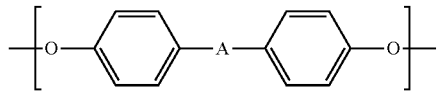
(10)

wherein -A- is a linear, branched, or cyclic divalent hydrocarbon group having 20 or less carbon atoms.

[Formula 18]

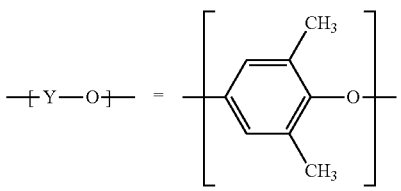
(11)

[Formula 19]

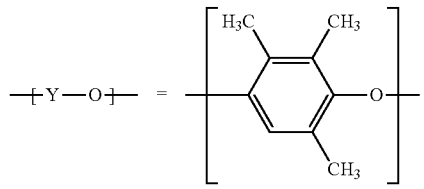
(12)

The method for manufacturing the modified polyphenylene ether represented by the above general formula (4) is not particularly limited. For example, the modified polyphenylene ether can be manufactured by vinylbenzyl-etherifying the terminal phenolic hydroxyl groups of a bifunctional phenylene ether oligomer obtained by oxidatively coupling a bifunctional phenol compound and a monofunctional phenol compound.

The number average molecular weight of the polyphenylene ether (A) is in the range of 500 to 5000, more preferably in the range of 1000 to 2500, in terms of polystyrene by a GPC method, in terms of handling properties. When the number average molecular weight is 500 or more, the resin composition is less likely to stick when provided in the form of a coating film. When the number average molecular weight is 5000 or less, a decrease in solubility in a solvent can be prevented.

The content of the polyphenylene ether (A) in the resin composition in the present embodiment can be appropriately set according to the desired performance, and is not particularly limited. However, the content of the polyphenylene ether (A) is preferably 40 to 80 parts by weight based on 100 parts by mass of the above-described (A) to (F) components, and is more preferably 45 to 75 parts by mass, particularly preferably 50 to 70 parts by mass, in terms of electrical properties, flame retardancy, and peel strength. The polyphenylene ether (A) is preferably the main component of the resin composition in the present embodiment. Generally, the flame retardancy of polyphenylene ether tends to be low, and therefore, the technical meaning of the above-described effect is especially significant in a form in which the main component of the resin composition in the present embodiment is the polyphenylene ether (A). Here, the main component means a component having the largest mass ratio among the above-described (A) to (F) components.

The phosphorus-containing cyanate ester compound (B) used in the resin composition in the present embodiment is represented by the following formula (13). By using the phosphorus-containing cyanate ester compound (B) having a phosphorus atom and a cyanato group in this manner, the flame retardancy and resin heat resistance of the obtained printed wiring board material can be improved. Examples of commercial products of the phosphorus-containing cyanate ester compound (B) represented by the following formula (13) include the commercial product FR-300 manufactured by Lonza.

[Formula 20]

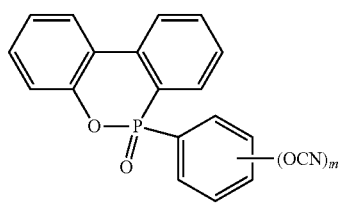

(13)

wherein m represents an integer of 1 to 3.

It is required that the content of the phosphorus-containing cyanate ester compound (B) represented by the above formula (13) in the resin composition in the present embodiment is 1 to 10 parts by mass based on 100 parts by mass of the total of the above-described (A) to (F) components in terms of heat resistance, flame retardancy, and electrical properties. The content of the phosphorus-containing cyanate ester compound (B) is preferably 2 to 8 parts by mass.

As the cyclophosphazene compound (C) used in the resin composition in the present embodiment, a known one can be appropriately used as long as it is a compound having a cyclic structure in which phosphorus and nitrogen are bonded alternately by a double bond. The type of the cyclophosphazene compound (C) is not particularly limited. Among them, for example, a compound represented by the following formula (14) is preferred in terms of being able to improve flame retardancy. Such a cyclophosphazene compound (C) is easily available as a commercial product. Examples of the commercial product include FP-100 (FUSHIMI Pharmaceutical Co., Ltd.), and SPS-100, SPB-100, and SPE-100 (Otsuka Chemical Co. Ltd.).

[Formula 21]

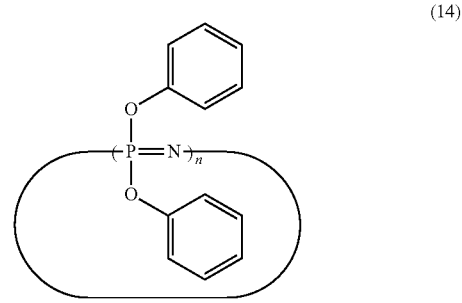

(14)

wherein n represents an integer of 3 to 6.

The content of the cyclophosphazene compound (C) in the resin composition in the present embodiment can be appropriately set according to the desired performance, and is not particularly limited. However, the content of the cyclophosphazene compound (C) is preferably 10 to 25 parts by mass based on 100 parts by mass of the total of the above-described (A) to (F) components, and is particularly preferably 15 to 20 parts by mass in terms of heat resistance, flame retardancy, and electrical properties.

As the halogen-free epoxy resin (D) used in the resin composition in the present embodiment, a known one can be appropriately used as long as it is an epoxy resin having two or more epoxy groups in one molecule, and comprising no halogen atoms. The type of the halogen-free epoxy resin (D) is not particularly limited. Specific examples thereof include bisphenol A-based epoxy resins, bisphenol E-based epoxy resins, bisphenol F-based epoxy resins, bisphenol S-based epoxy resins, phenol novolac-based epoxy resins, bisphenol A novolac-based epoxy resins, glycidyl ester-based epoxy resins, aralkyl novolac-based epoxy resins, biphenyl aralkyl-based epoxy resins, cresol novolac-based epoxy resins, polyfunctional phenol-based epoxy resins, naphthalene-based epoxy resins, anthracene-based epoxy resins, naphthalene skeleton-modified novolac-based epoxy resins, phenol aralkyl-based epoxy resins, naphthol aralkyl-based epoxy resins, dicyclopentadiene-based epoxy resins, biphenyl-based epoxy resins, alicyclic epoxy resins, polyol-based epoxy resins, phosphorus-containing epoxy resins, glycidyl amines, glycidyl esters, compounds obtained by epoxidizing the double bond of butadiene or the like, and compounds obtained by the reaction of hydroxyl group-containing silicone resins with epichlorohydrin. Among these halogen-free epoxy resins, naphthalene skeleton-modified novolac-based epoxy resins, bisphenol A-based epoxy resins, and cresol novolac-based epoxy resins are preferred in terms of heat resistance. One of these halogen-free epoxy resins can be used alone, or two or more of these halogen-free epoxy resins can be used in combination.

The content of the halogen-free epoxy resin (D) in the resin composition in the present embodiment can be appropriately set according to the desired performance, and is not particularly limited. However, the content of the halogen-free epoxy resin (D) is preferably 3 to 20 parts by mass based on 100 parts by mass of the total of the above-described (A) to (F) components, and is more preferably 5 to 15 parts by mass in terms of heat resistance, flame retardancy, and electrical properties.

As the cyanate ester compound (E) used in the resin composition in the present embodiment, a known one can be appropriately used as long as it is a compound having two or more cyanato groups in the molecule, and is one other than the phosphorus-containing cyanate ester compound (B) represented by the above formula (13). The type of the cyanate ester compound (E) is not particularly limited. Specific examples thereof include bisphenol A-based cyanate ester compounds and prepolymers thereof, naphthol aralkyl-based cyanate ester compounds and prepolymers thereof, 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis(4-cyanatophenyl)propane, 2,2-bis(3,5-dibromo-4-cyanatophenyl)propane, bis(4-cyanatophenyl)ether, bis(4-cyanatophenyl)thioether, bis(4-cyanatophenyl)sulfone, tris(4-cyanatophenyl)phosphite, tris(4-cyanatophenyl)phosphate, and cyanate ester compounds obtained by the reaction of novolacs with cyanogen halides. Among these, bisphenol A-based cyanate ester compounds and prepolymers thereof, and naphthol aralkyl-based cyanate ester compounds and prepolymers thereof are particularly preferred in terms of heat resistance. One of these cyanate ester compounds can be used alone, or two or more of these cyanate ester compounds can be used in combination.

The content of the cyanate ester compound (E) in the resin composition in the present embodiment can be appropriately set according to the desired performance, and is not particularly limited. However, the content of the cyanate ester compound (E) is preferably 5 to 30 parts by mass based on 100 parts by mass of the total of the above-described (A) to (F) components, and is more preferably 7 to 20 parts by mass in terms of electrical properties and flame retardancy. In addition, in terms of electrical properties, peel strength, and flame retardancy, the equivalent ratio of the cyanato groups of the above cyanate ester compound (E) to the epoxy groups of the above halogen-free epoxy resin (D) is preferably in the range of 2 to 8, more preferably 2 to 5.

The oligomer (F) of styrene and/or substituted styrene used in the resin composition in the present embodiment is a polymer of polystyrene having a crosslinked structure, or a copolymer of styrene and another aromatic vinyl compound. Here, examples of the aromatic vinyl compound include, but are not particularly limited to, α-methylstyrene, vinyltoluene, divinylbenzene, chlorostyrene, and bromostyrene. One of these oligomers of styrene and/or substituted styrene can be used alone, or two or more of these oligomers of styrene and/or substituted styrene can be used in combination. Examples of the method for manufacturing a styrene oligomer include, but are not particularly limited to, copolymerization with a divinyl compound, the use of a peroxide in combination, and radiation treatment. A known method can be appropriately used. For example, a styrene oligomer can also be manufactured by using a styrene monomer and divinylbenzene, and subjecting them to suspension polymerization, solution polymerization, or the like under a polymerization catalyst.

The number average molecular weight of the above oligomer (F) of styrene and/or substituted styrene can be appropriately set according to the desired performance, and is not particularly limited. However the number average molecular weight is preferably 200 to 1000, more preferably 300 to 800, in terms of polystyrene by a GPC method, in view of an improvement in heat resistance, and solubility in a solvent.

The content of the oligomer (F) of styrene and/or substituted styrene in the resin composition in the present embodiment can be appropriately set according to the desired performance, and is not particularly limited. However, the content of the oligomer (F) of styrene and/or substituted styrene is preferably 0.1 to 5 parts by mass based on 100 parts by mass of the total of the above-described (A) to (F) components, and is more preferably 0.5 to 4 parts by mass in terms of electrical properties.

For the filler (G) used in the resin composition in the present embodiment, a known one can be appropriately used, and the type of the filler (G) is not particularly limited. Those generally used in laminate applications can be preferably used. Specific examples thereof include inorganic fillers, such as silicas, such as natural silica, fused silica, synthetic silica, amorphous silica, AEROSIL, and hollow silica, white carbon, titanium white, zinc oxide, magnesium oxide, zirconium oxide, boron nitride, aggregated boron nitride, silicon nitride, aluminum nitride, barium sulfate, metal hydrates, such as aluminum hydroxide, heat-treated products of aluminum hydroxide (products obtained by heat-treating aluminum hydroxide to decrease part of the water of crystallization), boehmite, and magnesium hydroxide, molybdenum compounds, such as molybdenum oxide and zinc molybdate, zinc borate, zinc stannate, alumina, clay, kaolin, talc, fired clay, fired kaolin, fired talc, mica, E-glass, A-glass, NE-glass, C-glass, L-glass, D-glass, S-glass, M-glass G20, glass short fibers (including glass fine powders, such as E-glass, T-glass, D-glass, S-glass, and Q-glass), hollow glass, and spherical glass, and, in addition, organic fillers, such as rubber powders, such as styrene-based rubber powders, butadiene-based rubber powders, and acrylic-based rubber powders, core-shell-based rubber powders, silicone resin powders, silicone rubber powders, and silicone composite powders. Among these, silicas and talc are preferred, and in terms of electrical properties, silicas are particularly preferred. One of these fillers can be used alone, or two or more of these fillers can be used in combination.

The average particle diameter (D50) of the filler (G) in the resin composition of the present embodiment is not particularly limited. Considering dispersibility, flow properties during molding, breakage during the use of a small diameter drill bit, and the like, the average particle diameter (D50) is preferably 0.1 to 3 μm. Examples of such a preferred filler having an average particle diameter (D50) of 0.1 to 3 μm include mesoporous silica, spherical fused silica, spherical synthetic silica, and hollow spherical silica. The average particle diameter (D50) of the filler (G) herein means a median diameter (D50), and is a value at which the larger side and the smaller side are equivalent when the measured particle size distribution of the powder is divided into two. More specifically, the average particle diameter (D50) of the filler (G) means a value when the particle size distribution of the powder in a predetermined amount which is introduced into an aqueous dispersion medium is measured by a laser diffraction scattering particle size distribution measuring apparatus, and 50% of the total volume is reached in volume summation from a small particle.

The content of the filler (G) in the resin composition in the present embodiment can be appropriately set according to the desired performance, and is not particularly limited. However, the content of the filler (G) is preferably 20 to 150 parts by mass based on 100 parts by mass of the total of the above-described (A) to (F) components, and is more preferably 40 to 100 parts by mass in terms of flame retardancy, peel strength, moldability, heat resistance, and electrical properties.

Here, in using the filler (G), a silane coupling agent and a wetting and dispersing agent are preferably used in combination. As the silane coupling agent, those generally used for the surface treatment of inorganic matter can be preferably used, and the type of the silane coupling agent is not particularly limited. Specific examples thereof include aminosilane-based silane coupling agents, such as γ-aminopropyltriethoxysilane and N-β-(aminoethyl)-γ-aminopropyltrimethoxysilane, epoxysilane-based silane coupling agents, such as γ-glycidoxypropyltrimethoxysilane and β-(3,4-epoxycyclohexyl)ethyltrimethoxysilane, vinylsilane-based silane coupling agents, such as γ-methacryloxypropyltrimethoxysilane and vinyl-tri(β-methoxyethoxy)silane, cationic silane-based silane coupling agents, such as N-β-(N-vinylbenzylaminoethyl)-γ-aminopropyltrimethoxysilane hydrochloride, and phenylsilane-based silane coupling agents. One silane coupling agent can be used alone, or two or more silane coupling agents can be used in combination. As the wetting and dispersing agent, those generally used for paints can be preferably used, and the type of the wetting and dispersing agent is not particularly limited. Preferably, copolymer-based wetting and dispersing agents are used. Specific examples thereof include Disperbyk-110, 111, 161, and 180, BYK-W996, BYK-W9010, BYK-W903, and BYK-W940 manufactured by BYK Japan KK. One wetting and dispersing agent can be used alone, or two or more wetting and dispersing agents can be used in combination.

In addition, the resin composition in the present embodiment may contain a curing accelerator for appropriately adjusting curing speed, as required. As this curing accelerator, those generally used as curing accelerators for cyanate ester compounds and epoxy compounds can be preferably used, and the type of the curing accelerator is not particularly limited. Specific examples thereof include organometallic salts of copper, zinc, cobalt, nickel, manganese, and the like, imidazoles and derivatives thereof, and tertiary amines. One curing accelerator can be used alone, or two or more curing accelerators can be used in combination. The amount of the curing accelerator used can be appropriately adjusted considering the degree of cure of the resins, the viscosity of the resin composition, and the like, and is not particularly limited. The amount of the curing accelerator used is usually about 0.005 to 3 parts by mass based on 100 parts by mass of the total of the above-described (A) to (F) components.

Further, the resin composition in the present embodiment may contain components other than those described above as long as the desired properties are not impaired. Examples of such optional blending materials include various polymer compounds, such as thermosetting resins, thermoplastic resins, and oligomers thereof, and elastomers, a flame-retardant compound, and various additives. These are not particularly limited as long as they are those generally used. Examples of the flame-retardant compound include bromine compounds, such as 4,4'-dibromobiphenyl, phosphate esters, melamine phosphate, phosphorus-containing epoxy resins, nitrogen compounds, such as melamine and benzoguanamine, oxazine ring-containing compounds, and silicone-based compounds. In addition, examples of the various additives include a curing catalyst, an ultraviolet absorbing agent, an antioxidant, a photopolymerization initiator, a fluorescent brightening agent, a photosensitizer, a dye, a pigment, a thickening agent, a flow-adjusting agent, a lubricant, a defoaming agent, a dispersing agent, a leveling agent, a brightening agent, and a polymerization inhibitor. One of these optional blending materials can be used alone, or two or more of these optional blending materials can be used in combination.

The resin composition in the present embodiment may contain an organic solvent as required. In this case, the resin composition in the present embodiment can be used as a form (of solution or varnish) in which at least part, preferably all, of the above-described various resin components are dissolved in or compatible with the organic solvent. As the organic solvent, a known one can be appropriately used as long as it is capable of dissolving or being compatible with at least part, preferably all, of the above-described various resin components. The type of the organic solvent is not particularly limited. Specific examples thereof include polar solvents, such as ketones, such as acetone, methyl ethyl ketone, and methyl isobutyl ketone, and amides, such as dimethylacetamide and dimethylformamide, and nonpolar solvents, such as aromatic hydrocarbons, such as toluene and xylene. One organic solvent can be used alone, or two or more organic solvents can be used in combination.

The resin composition in the present embodiment can be used as an insulating layer of a printed wiring board, and a semiconductor package material. For example, a prepreg can be provided by impregnating or coating a base material with a solution of the resin composition in the present embodiment dissolved in a solvent, and drying the solution.

A buildup film or a dry film solder resist also can be provided by using a peelable plastic film as a base material, coating the plastic film with a solution of the resin composition in the present embodiment dissolved in a solvent, and drying the solution. Here, the solvent can be dried by heating at a temperature of 20° C. to 150° C. for 1 to 90 minutes. In addition, the resin composition can also be used in an uncured state in which only the solvent is dried, or in a semi-cured (B-staged) state as required.

A prepreg in the present embodiment will be described in detail below. The prepreg in the present embodiment is obtained by impregnating or coating a base material with the resin composition in the present embodiment described above. The method for manufacturing the prepreg is not particularly limited as long as it is a method of combining the resin composition in the present embodiment with a base material to manufacture a prepreg. Specifically, the prepreg in the present embodiment can be manufactured by impregnating or coating a base material with the resin composition in the present embodiment, and then semi-curing the resin composition by a method of drying at 120 to 220° C. for about 2 to 15 minutes, or the like. At this time, the amount of the resin composition adhered to the base material, that is, the amount of the resin composition (including the filler (G)) based on the total amount of the prepreg after the semi-curing, is preferably in the range of 20 to 95% by mass.

As the base material used when manufacturing the prepreg in the present embodiment, known ones used for various printed wiring board materials can be used. Examples thereof include, but are not particularly limited to, woven fabrics of glass fibers, such as E-glass, D-glass, L-glass, S-glass, T-glass, Q-glass, UN-glass, NE-glass, and spherical glass, inorganic fibers other than glass, such as quartz, organic fibers, such as polyimides, polyamides, and polyesters, and liquid crystal polyesters. As the shape of the base material, woven fabrics, nonwoven fabrics, rovings, chopped strand mats, surfacing mats, and the like are known, and the shape of the base material may be any. One base material can be used alone, or two or more base materials can be used in combination. The thickness of the base material is not particularly limited, but is preferably in the range of 0.01 to 0.2 mm in laminate applications. Particularly, woven fabrics subjected to ultra-opening treatment or clogging treatment are preferred in terms of dimensional stability. Glass woven fabrics surface-treated with silane coupling agents for epoxysilane treatment, aminosilane treatment, and the like are also preferred in terms of heat resistance property upon moisture absorption. Liquid crystal polyester woven fabrics are also preferred in terms of electrical properties.

A metal foil-clad laminate in the present embodiment is obtained by stacking at least one or more of the above-described prepregs, disposing metal foil on one surface or both surfaces of the resulting stack, and laminate molding the metal foil and the stack. Specifically, the metal foil-clad laminate in the present embodiment can be fabricated by stacking one or a plurality of the above-described prepregs, disposing metal foil, such as copper or aluminum, on one surface or both surfaces of the resulting stack, and laminate-molding the metal foil and the stack. The metal foil used here is not particularly limited as long as it is one used for a printed wiring board material. Copper foil, such as rolled copper foil and electrolytic copper foil, is however preferred. Considering conductor loss in the high frequency region, electrolytic copper foil having small matte surface roughness is more preferred. The thickness of the metal foil is not particularly limited, but is preferably 2 to 70 µm, more preferably 3 to 35 µm. As the molding conditions, usual methods for laminates and multilayer boards for printed wiring boards can be applied. For example, the metal foil-clad laminate in the present embodiment can be manufactured by laminate molding with a temperature of 180 to 220° C., a heating time of 100 to 300 minutes, and a surface pressure of 20 to 40 kg/cm$^2$ using a multistage press, a multistage vacuum press, a continuous molding machine, an autoclave molding machine, or the like. A multilayer board can also be provided by laminate-molding the above prepreg and a separately fabricated wiring board for an inner layer in combination. As the method for manufacturing a multilayer board, for example, a multilayer board can be fabricated by disposing 35 µm copper foil on both surfaces of one of the above-described prepreg, laminate-molding them under the above conditions, then forming inner layer circuits, subjecting the circuits to blackening treatment to form an inner layer circuit board, then alternately disposing the inner layer circuit boards and the above prepregs one by one, further disposing copper foil on the outermost layers, and laminate-molding them under the above conditions preferably under vacuum.

The metal foil-clad laminate in the present embodiment can be preferably used as a printed wiring board. The printed wiring board can be manufactured according to an ordinary method, and the method for manufacturing the printed wiring board is not particularly limited. One example of a method for manufacturing a printed wiring board will be shown below. First, a metal foil-clad laminate, such as the above-described copper-clad laminate, is prepared. Next, a surface of the metal foil-clad laminate is subjected to etching treatment to form an inner layer circuit to fabricate an inner layer board. The inner layer circuit surface of this inner layer board is subjected to surface treatment for increasing adhesive strength, as required. Then, the required number of the above-described prepregs are stacked on the inner layer circuit surface, metal foil for an outer layer circuit is further laminated on the outside of the stack, and the laminate is heated and pressurized for integral molding. In this manner, a multilayer laminate in which an insulating layer comprising a base material and a cured product of a thermosetting resin composition is formed between an inner layer circuit and metal foil for an outer layer circuit is manufactured. Then, this multilayer laminate is subjected to perforation for through holes and via holes, and then, a plated metal film that allows conduction between the inner layer circuit and the metal foil for an outer layer circuit is formed on the wall surface of this hole. Further, the metal foil for an outer layer circuit is subjected to etching treatment to form an outer layer circuit, and thus, a printed wiring board is manufactured.

The printed wiring board obtained in the above manufacturing example has a configuration in which it has an insulating layer and a conductor layer formed on a surface of this insulating layer, and the insulating layer comprises the resin composition in the present embodiment described above. In other words, the prepreg in the present embodiment described above (the base material and the resin composition in the present embodiment with which the base material is impregnated or coated), and the resin composition layer of the metal foil-clad laminate in the present embodiment described above (the layer comprising the resin composition in the present embodiment) are composed of an insulating layer comprising the resin composition in the present embodiment.

On the other hand, a laminated sheet in the present embodiment can be obtained by coating a sheet base material with a solution of the above resin composition in the present embodiment dissolved in a solvent, and drying the solution. Examples of the sheet base material used here include, but are not particularly limited to, organic film base materials, such as polyethylene films, polypropylene films, polycarbonate films, polyethylene terephthalate films, ethylene tetrafluoroethylene copolymer films, and release films obtained by coating surfaces of these films with a release agent, and polyimide films, conductor foil, such as copper foil and aluminum foil, and plate-shaped base materials, such as glass plates, SUS plates, and FRP. Examples of the coating method include a method of coating a sheet base material with a solution of the resin composition in the present embodiment dissolved in a solvent by a bar coater, a die coater, a doctor blade, a baker applicator, or the like. A single-layer sheet (resin sheet) can also be provided by peeling or etching the sheet base material from the laminated sheet after drying. A single-layer sheet (resin sheet) can also be obtained without using a sheet base material, by feeding a solution of the above resin composition in the present embodiment dissolved in a solvent into a mold having a sheet-shaped cavity, and drying the solution, or the like for sheet shape molding.

In the fabrication of the single-layer or laminated sheet in the present embodiment, the drying conditions when removing the solvent are not particularly limited, but are preferably a temperature of 20° C. to 170° C. for 1 to 90 minutes because at low temperature, the solvent is likely to remain in the resin composition, and at high temperature, the curing of the resin composition proceeds. The thickness of the resin layer of the single-layer or laminated sheet in the present embodiment can be adjusted by the concentration and coating thickness of the solution of the resin composition in the present embodiment, and is not particularly limited. The thickness is preferably 0.1 to 500 µm because generally, when the coating thickness increases, the solvent is likely to remain during drying.

EXAMPLES

The present invention will be described in more detail below by giving Examples and Comparative Examples, but the present invention is not limited by these. "Parts" indicates "parts by mass" unless otherwise noticed below.

Example 1

55 parts by mass of vinylbenzyl-modified polyphenylene ether (OPE-2St 1200, a polyphenylene oligomer having vinyl groups at both ends (a reaction product of a 2,2',3,3',5,5'-hexamethylbiphenyl-4,4'-diol.2,6-dimethylphenol polycondensation product and chloromethylstyrene), manufactured by MITSUBISHI GAS CHEMICAL COMPANY, INC., number average molecular weight 1187, vinyl group equivalent: 590 g/eq.), 2.0 parts by mass of a phosphorus-containing cyanate ester compound in which m in the above formula (13) was 2 (FR-300, manufactured by Lonza Japan Ltd., cyanate equivalent: 187 g/eq.), 18.8 parts by mass of a cyclophosphazene compound that was a mixture in which n in the above formula (14) was 3 to 6 (FP-100, manufactured by FUSHIMI Pharmaceutical Co., Ltd.), 8.9 parts by mass of a cresol novolac-based epoxy resin (N680, manufactured by DIC, epoxy equivalent: 215 g/eq.), 12.8 parts by mass of a bisphenol A-based cyanate ester compound (CA210, manufactured by MITSUBISHI GAS CHEMICAL COMPANY, INC., cyanate equivalent: 139 g/eq.), 2.5 parts by mass of a styrene oligomer (KA3085, manufactured by Eastman Chemical Japan Ltd., number average molecular weight 604), 75 parts by mass of spherical silica (SC2050, manufactured by Admatechs Company Limited, average particle diameter 0.5 µm), and 0.034 parts by mass of manganese octylate were mixed, and the solids were diluted with methyl ethyl ketone to 65% by mass to obtain a varnish. An E-glass cloth having a thickness of 0.08 mm was impregnated and coated with the varnish obtained in this manner, and heated and dried at 170° C. for 5 minutes using a dryer (pressure-resistant and explosion-proof steam dryer, manufactured by Takasugi-Seisakusho)) to obtain a prepreg comprising 55% by mass of a resin composition. Then, eight of the prepregs were stacked, and 18 µm copper foil (3EC-III, manufactured by Mitsui Mining & Smelting Co., Ltd.) was disposed on both surfaces of the obtained laminate. The laminate with the copper foil was subjected to vacuum pressing at a pressure of 30 kg/cm$^2$ and a temperature of 210° C. for 150 minutes to obtain a both surface copper foil-clad laminate having a thickness of about 0.8 mm. Using the obtained both surface copper foil-clad laminate, the measurement and evaluation of flame resistance, thermal expansion coefficients, heat resistance property upon moisture absorption, glass transition temperature, electrical properties, and peel strength were performed. The results of these are shown in Table 1.

(Measurement and Evaluation Methods)
1) Flame resistance: The both surface copper foil-clad laminate having a thickness of about 0.8 mm was cut to a size of 13 mm×130 mm×about 0.8 mm thick by a dicing saw, and then, all the copper foil on both surfaces was removed by etching to obtain a test piece. A flame resistance test was carried out according to the UL94 vertical test method using this test piece (n=5).
2) Thermal expansion coefficients ($\alpha 1$ and $\alpha 2$): All the copper foil of the both surface copper foil-clad laminate having a thickness of about 0.8 mm was removed by etching to obtain a test piece. The thermal expansion coefficients in the thickness direction were measured by the TMA method prescribed in JIS C6481 using this test piece, and using a thermomechanical analyzer (manufactured by TA Instruments).
3) Heat resistance property upon moisture absorption: The both surface copper foil-clad laminate having a thickness of about 0.8 mm was cut to a size of 50 mm×50 mm×about 0.8 mm thick by a dicing saw, and then, all the copper foil except half of the copper foil on one surface was removed by etching to obtain a test piece in which half of the copper foil remained only on one surface. This test piece was dried at 115° C. for 20 hours, then treated at 121° C. and 2 atm by a pressure cooker tester (model PC-3 manufactured by HIRAYAMA MANUFACTURING CORPORATION) for 3 hours, and then immersed in a solder bath at 288° C. for 30 seconds. The presence or absence of blisters was visually observed, and determined as no abnormality: (◯) or the occurrence of blisters: (X) (n=3).
4) Glass transition temperature (Tg): The both surface copper foil-clad laminate having a thickness of about 0.8 mm was cut to a size of 40 mm×20 mm×about 0.8 mm thick by a dicing saw to obtain a test piece. The glass transition temperature was measured by a dynamic viscoelasticity analyzer (manufactured by TA Instruments) by a DMA method according to JIS C6481 using the obtained test piece.
5) Dielectric loss tangent: The dielectric loss tangent at 2 GHz was measured by a cavity resonator perturbation method (Agilent 8722ES, manufactured by Agilent Technologies) using a test piece obtained by removing all the copper foil of the both surface copper foil-clad Laminate having a thickness of about 0.8 mm.
6) Peel strength: The copper foil peel strength was measured according to JIS C6481, Test methods of copper-clad laminates for printed wiring boards (see 5.7 Peel Strength), using a test piece of the both surface copper foil-clad laminate having a thickness of about 0.8 mm (30 mm×150 mm×about 0.8 mm thick).

Example 2

Operation was performed as in Example 1 except that the amount of the phosphorus-containing cyanate ester compound (FR-300) blended was changed to 5.0 parts by mass, the amount of the cyclophosphazene compound (FP-100) blended was changed to 17.0 parts by mass, the amount of the cresol novolac-based epoxy resin (N680) blended was changed to 9.3 parts by mass, the amount of the cyanate ester compound (CA210) blended was changed to 11.2 parts by mass, and the amount of the manganese octylate blended was changed to 0.043 parts by mass. The various physical property values of the obtained both surface copper foil-clad laminate are shown in Table 1.

Example 3

Operation was performed as in Example 1 except that the amount of the vinylbenzyl-modified polyphenylene ether (OPE-2St 1200) blended was changed to 53 parts by mass, the amount of the phosphorus-containing cyanate ester compound (FR-300) blended was changed to 3.0 parts by mass, the amount of the cyclophosphazene compound (FP-100) blended was changed to 18.0 parts by mass, the amount of the cresol novolac-based epoxy resin (N680) blended was changed to 7.0 parts by mass, the amount of the cyanate ester compound (CA210) blended was changed to 12.4 parts by mass, 4.6 parts by mass of a bisphenol A-based epoxy resin (E-1051, manufactured by DIC, epoxy equivalent: 475 g/eq.) was further blended, and 0.10 parts by mass of an imidazole compound (2P4MZ, manufactured by SHIKOKU CHEMICALS CORPORATION) was blended instead of the manganese octylate. The various physical property values of the obtained both surface copper foil-clad laminate are shown in Table 1.

Comparative Example 1

55 Parts by mass of the vinylbenzyl-modified polyphenylene ether (OPE-2St) used in Example 1, 20.0 parts by mass of the cyclophosphazene compound (FP-100) used in Example 1, 8.6 parts by mass of the cresol novolac-based epoxy resin (N680) used in Example 1, 13.9 parts by mass of the cyanate ester compound (CA210) used in Example 1, 2.5 parts by mass of the styrene oligomer (KA3085) used in Example 1, 75 parts by mass of the spherical silica (SC2050) used in Example 1, and 0.009 parts by mass of the manganese octylate used in Example 1 were mixed, and the mixture was diluted with methyl ethyl ketone to 65% by mass of the solids to obtain a varnish. Operation was performed as in Example 1 except that the varnish obtained in this manner was used. The various physical property values of the obtained both surface copper foil-clad laminate are shown in Table 2.

Comparative Example 2

Operation was performed as in Comparative Example 1 except that the amount of the cresol novolac-based epoxy resin (N680) blended was changed to 6.2 parts by mass, the amount of the cyanate ester compound (CA210) blended was changed to 12.2 parts by mass, the amount of the manganese octylate blended was changed to 0.008 parts by mass, and 4.1 parts by mass of the bisphenol A-based epoxy resin (E-1051) used in Example 3 was further blended. The various physical property values of the obtained both surface copper foil-clad laminate are shown in Table 2.

Comparative Example 3

Operation was performed as in Comparative Example 1 except that 20.0 parts by mass of the phosphorus-containing cyanate ester compound (FR-300) used in Example 1 was used instead of the cyclophosphazene compound, and the amount of the manganese octylate blended was changed to 0.010 parts by mass. The various physical property values of the obtained both surface copper foil-clad laminate are shown in Table 2.

As is clear from Tables 1 and 2, it was confirmed that by using the resin compositions of the present invention, prepregs and printed wiring boards that not only had high flame retardancy but also had excellent heat resistance, peel strength with copper foil, thermal expansion coefficient, heat resistance property upon moisture absorption, and electrical properties could be provided. In addition, by using a resin composition comprising only halogen-free compounds, the burden on the environment is reduced.

This application claims priority from Japanese Patent Application No. 2012-077449 filed with the Japan Patent Office on Mar. 29, 2012, the content of which is incorporated herein by reference.

INDUSTRIAL APPLICABILITY

As described above, the resin composition of the present invention can be widely and effectively utilized in various applications, such as electrical and electronic materials, machine tool materials, and aviation materials, for example, as electrical insulating materials, semiconductor plastic packages, sealing materials, adhesives, lamination materials, resists, and buildup laminate materials, and, particularly, can be especially effectively utilized as printed wiring board materials addressing higher integration and higher density, for information terminal equipment, communication equipment, and the like in recent years. In addition, the laminate, metal foil-clad laminate, and the like of the present invention not only have high flame retardancy but have excellent performance also in heat resistance, peel strength with copper foil, thermal expansion coefficient, heat resistance property upon moisture absorption, and electrical properties, and therefore, their industrial practicality is extremely high.

TABLE 1

| Evaluation item | | Unit | Example 1 | Example 2 | Example 3 |
|---|---|---|---|---|---|
| Flame resistance | | — | V-0 | V-0 | V-0 |
| Thermal expansion coefficients | Z direction ($\alpha 1$) | ppm/° C. | 46 | 49 | 48 |
| | Z direction ($\alpha 2$) | ppm/° C. | 255 | 250 | 228 |
| Heat resistance property upon moisture absorption | | — | ooo | ooo | ooo |
| Glass transition temperature | | ° C. | 205 | 210 | 197 |
| Dielectric loss tangent | | — | 0.0061 | 0.0060 | 0.0055 |
| Peel strength | | kN/m | 0.90 | 0.94 | 0.99 |

TABLE 2

| Evaluation item | | Unit | Comparative Example 1 | Comparative Example 2 | Comparative Example 3 |
|---|---|---|---|---|---|
| Flame resistance | | — | V-1 | V-1 | V-0 |
| Thermal expansion coefficients | Z direction ($\alpha 1$) | ppm/° C. | 58 | 57 | 45 |
| | Z direction ($\alpha 2$) | ppm/° C. | 278 | 270 | 250 |
| Heat resistance property upon moisture absorption | | — | ooo | ooo | xxx |
| Glass transition temperature | | ° C. | 201 | 202 | 220 |
| Dielectric loss tangent | | — | 0.0062 | 0.0058 | 0.0053 |
| Peel strength | | kN/m | 0.96 | 0.85 | 0.72 |

The invention claimed is:

1. A resin composition comprising:
   40 to 80 parts by mass of polyphenylene ether (A) having a number average molecular weight of 500 to 5000,
   1 to 10 parts by mass of a phosphorus-containing cyanate ester compound (B) represented by the following formula (13):

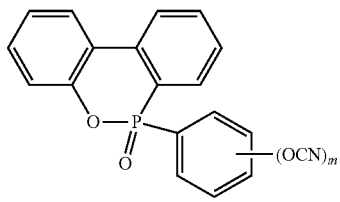
(13)

wherein m represents an integer of 1 to 3,
   10 to 25 parts by mass of a cyclophosphazene compound (C),
   3 to 20 parts by mass of a halogen-free epoxy resin (D),
   5 to 30 parts by mass of a cyanate ester compound (E) other than the phosphorus-containing cyanate ester compound (B),
   0.1 to 5 parts by mass of an oligomer of styrene and/or substituted styrene (F), and
   20 to 150 parts by mass of a filler (G),
   wherein the individual amounts of (A), (B), (C), (D), (E), (F), and (G) are each based on 100 parts by mass of the total of (A), (B), (C), (D), (E), and (F).

2. The resin composition according to claim 1, wherein the cyclophosphazene compound (C) is represented by the following formula (14):

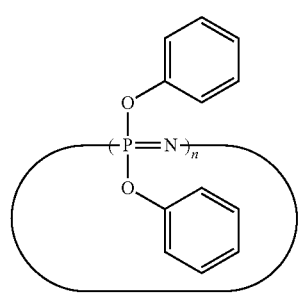
(14)

wherein n represents an integer of 3 to 6.

3. The resin composition according to claim 1, wherein the polyphenylene ether (A) is represented by the following general formula (4):

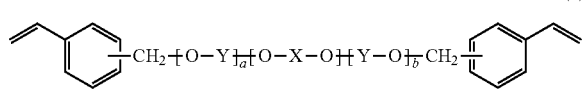
(4)

wherein —(O—X—O)— is a structure represented by the following general formula (5) or (6):

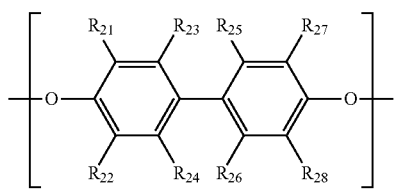
(5)

wherein $R_{21}$, $R_{22}$, $R_{23}$, $R_{27}$, and $R_{28}$ are each an alkyl group having 6 or less carbon atoms, or a phenyl group, and may be the same as or different from each other, and $R_{24}$, $R_{25}$, and $R_{26}$ are each a hydrogen atom, an alkyl group having 6 or less carbon atoms, or a phenyl group, and may be the same as or different from each other,

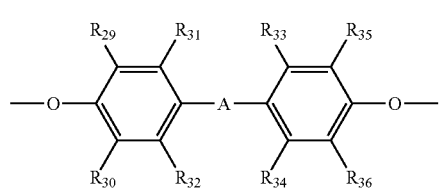
(6)

wherein $R_{29}$, $R_{30}$, $R_{31}$, $R_{32}$, $R_{33}$, $R_{34}$, $R_{35}$, and $R_{36}$ are each a hydrogen atom, an alkyl group having 6 or less carbon atoms, or a phenyl group, and may be the same as or different from each other, and -A- is a linear, branched, or cyclic divalent hydrocarbon group having 20 or less carbon atoms,
   —(Y—O)— is a structure represented by the following general formula (7):

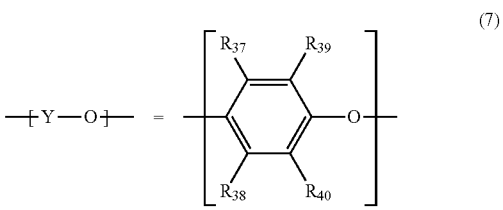
(7)

wherein $R_{39}$ and $R_{40}$ are each an alkyl group having 6 or less carbon atoms, or a phenyl group, and may be the same as or different from each other, and $R_{37}$ and $R_{38}$ are each a hydrogen atom, an alkyl group having 6 or less carbon atoms, or a phenyl group, and may be the same as or different from each other,
   as —(Y—O)—, one type of structure or two or more types of structures are randomly arranged; and
   a and b each independently represent an integer of 0 to 100, at least either one being not 0.

4. The resin composition according to claim 1, wherein the halogen-free epoxy resin (D) is one or more selected from the group consisting of a naphthalene-modified epoxy resin, a cresol novolac-based epoxy resin, and a bisphenol A-based epoxy resin.

5. The resin composition according to claim 1, wherein the cyanate ester compound (E) other than the phosphorus-containing cyanate ester compound (B) is one or more selected from the group consisting of a bisphenol A-based cyanate ester compound and a naphthol aralkyl-based cyanate ester compound.

6. The resin composition according to claim 1, wherein the oligomer of styrene and/or substituted styrene (F) has a number average molecular weight of 200 to 1000.

7. The resin composition according to claim 1, wherein the filler (G) is silica.

8. A prepreg obtained by impregnating or coating a base material with the resin composition according to claim 1.

9. A metal foil-clad laminate obtained by
stacking at least one or more prepregs according to claim 8;
disposing metal foil on one surface or both surfaces of an resulting stack; and
laminate-molding the metal foil and the stack.

10. A single-layer sheet obtained by forming the resin composition according to claim 1 into a sheet shape.

11. A laminated sheet obtained by
coating a surface of a sheet base material with the resin composition according to claim 1; and
drying the resin composition.

12. The laminated sheet according to claim 11, wherein the sheet base material is one or more selected from the group consisting of a film containing polyvinyl chloride, polyvinylidene chloride, polybutene, polybutadiene, polyurethane, an ethylene-vinyl acetate copolymer, polyethylene terephthalate, polyethylene, polypropylene, an ethylene-propylene copolymer, polymethylpentene, or polybutylene terephthalate; aluminum foil; and copper foil.

13. A printed wiring board comprising an insulating layer and a conductor layer formed on a surface of the insulating layer, wherein
the insulating layer comprises the resin composition according to claim 1.

* * * * *